United States Patent [19]

Liang et al.

[11] Patent Number: 5,909,513
[45] Date of Patent: Jun. 1, 1999

[54] BIT ALLOCATION FOR SEQUENCE IMAGE COMPRESSION

[75] Inventors: Kyminh Liang; Chien-Min Huang, both of Logan; Paul D. Israelsen, North Logan; Scott E. Budge, Logan, all of Utah

[73] Assignee: Utah State University, Logan, Utah

[21] Appl. No.: 08/713,400

[22] Filed: Sep. 13, 1996

Related U.S. Application Data

[63] Continuation-in-part of application No. 08/555,434, Nov. 9, 1995, Pat. No. 5,799,110, and a continuation-in-part of application No. 08/555,435, Nov. 9, 1995.

[51] Int. Cl.$^6$ ............................... G06K 9/36; H04N 7/30
[52] U.S. Cl. ....................... 382/253; 382/232; 348/405; 348/419
[58] Field of Search ........................ 382/253, 232–233, 382/239–240, 250–251; 348/405, 414–415, 417–419, 420–422

[56] References Cited

U.S. PATENT DOCUMENTS

| | | | |
|---|---|---|---|
| 4,560,977 | 12/1985 | Murakami et al. | 364/807 |
| 4,639,778 | 1/1987 | Yamaguchi et al. | 348/391 |
| 4,652,905 | 3/1987 | Lippel | 348/472 |
| 4,670,851 | 6/1987 | Murakami et al. | 348/418 |
| 4,710,812 | 12/1987 | Murakami et al. | 348/417 |
| 4,772,946 | 9/1988 | Hammer | 348/406 |
| 4,903,317 | 2/1990 | Nishihara et al. | 382/248 |
| 4,933,762 | 6/1990 | Guichard et al. | 348/388 |
| 4,943,855 | 7/1990 | Bheda et al. | 348/398 |
| 4,958,225 | 9/1990 | Bi et al. | 348/422 |
| 5,031,037 | 7/1991 | Israelsen | 348/422 |
| 5,124,791 | 6/1992 | Israelsen et al. | 348/417 |
| 5,172,228 | 12/1992 | Israelsen | 348/422 |
| 5,194,864 | 3/1993 | Nakano | 348/422 |
| 5,194,950 | 3/1993 | Murakami et al. | 348/417 |
| 5,204,899 | 4/1993 | Israelsen et al. | 348/405 |
| 5,231,485 | 7/1993 | Israelsen et al. | 348/405 |
| 5,235,418 | 8/1993 | Lucas | 348/418 |

(List continued on next page.)

OTHER PUBLICATIONS

Linde, Y. et al., "An Algorithm for Vector Quantizer Design," IEEE Transactions on Communications, vol. Com–28., No. 1, pp. 84–95 (Jan. 1980).

Juang, B.H. et al., "Multiple Stage Vector Quantization for Speech Coding," ICASSP Proceedings, vol. 1:597–600 (Apr. 1982).

Makhoul, J., et al., "Vector Quantization in Speech Coding," IEEE Proceedings, vol. 73, No. 11, pp. 1551–1588 (Nov. 1985).

Gray, R.M., "Vector Quantization," IEEE ASSP Magazine, pp. 4–29 (Apr. 1984).

(List continued on next page.)

*Primary Examiner*—Leo H. Boudreau
*Assistant Examiner*—Bhavesh Mehta
*Attorney, Agent, or Firm*—Trask, Britt & Rossa

[57] ABSTRACT

The invention relates to a method and system for allocating bits for representing blocks that are transmitted in an image compression system. In a preferred embodiment, a video telephone communications system includes a video transmitting/receiving (transceiving) system including local and remote processing systems separated by a communications link. The local processing system determines indices to be sent to a remote processing system to represent the image. Under one aspect of the invention, the local processing system determines an optimal bit allocation in which the following relationship may be minimized $DR=D+\lambda R$, where D is the total distortion $\Sigma d_i$ for a frame; $\lambda$ is a value determined as described below; $R=\Sigma r_i \approx R_d$ which is the desired total number of bits for the frame. The optimal bit allocation may determine $\lambda$ for an entire frame. Under other aspects of the invention a lambda feedback technique, with or without predecision, may be used. The lambda feedback techniques may determine $\lambda$ block by block. Conditional update preselection and mode preselection are other reduced complexity procedures.

25 Claims, 8 Drawing Sheets

U.S. PATENT DOCUMENTS

| | | | |
|---|---|---|---|
| 5,247,348 | 9/1993 | Israelsen et al. | 348/417 |
| 5,255,346 | 10/1993 | Wu et al. | 348/417 |
| 5,263,100 | 11/1993 | Kim et al. | 382/166 |
| 5,272,529 | 12/1993 | Frederiksen | 348/405 |
| 5,327,502 | 7/1994 | Katata et al. | 382/239 |
| 5,371,544 | 12/1994 | Jacquin et al. | 348/398 |
| 5,432,554 | 7/1995 | Nickerson et al. | 348/391 |
| 5,440,346 | 8/1995 | Alattar et al. | 348/420 |
| 5,450,132 | 9/1995 | Harris et al. | 348/418 |
| 5,457,495 | 10/1995 | Hartung | 348/418 |
| 5,459,518 | 10/1995 | Wickstrom | 348/420 |
| 5,487,086 | 1/1996 | Bhaskar | 348/405 |
| 5,487,119 | 1/1996 | Kimura et al. | 382/239 |
| 5,488,568 | 1/1996 | Keith et al. | 382/232 |
| 5,491,513 | 2/1996 | Wickstrom et al. | 348/415 |
| 5,521,988 | 5/1996 | Li et al. | 382/248 |
| 5,533,138 | 7/1996 | Kim et al. | 382/232 |
| 5,543,844 | 8/1996 | Mita et al. | 348/405 |
| 5,691,770 | 11/1997 | Keesman et al. | 348/405 |

OTHER PUBLICATIONS

Elnahas, S.E., et al., "Progressive Coding and Transmission of Digital Diagnostic Pictures," IEEE Trans. on Medical Imaging, vol. MI-5, No. 2, pp. 73-83 (Jun. 1986).

Elnahas, S.E., Data Compression With Application to Digital Radiology, Ph.D. Dissertation, Washington University, Sever Institute of Technology, pp. 56-68 (Aug. 1984).

Sullivan G.J., et al., "Efficient Quadtree Coding of Images and Video," IEEE Transactions on Image Processing, vol. 3, No. 3, pp. 327-331 (May 1994).

Venbrux, J., et al., "A VLSI Chip Set for High-Speed Lossless Data Compression," IEEE Transactions on Circuits and Systems for Video Technology, vol. 2, No. 4, pp. 381-391 (Dec. 1992).

Wallace, G.K., "The JPEG Still Picture Compression Standard," IEEE Transactions on Consumer Electronics, vol. 38, No. 1, pp. xviii-xxxiv (Feb. 1992).

Shoham Y., et al., "Efficient Bit Allocation for an Arbitrary Set of Quantizers," IEEE Transactions on Acoustics, Speech, and Signal Processing, vol. 36, No. 9, pp. 1145-1453 (Sep. 1988).

Cosman et al., "Using Vector Quantization for Image Processing," vol. 36, No. 9, pp. 1445-1453, (Sep. 1988).

BIT ALLOCATION FOR SEQUENCE IMAGE COMPRESSION

RELATED APPLICATIONS

This is a continuation-in-part of U.S. Pat. application Ser. No. 08/555,434, filed Nov. 9, 1995, U.S. Pat. No. 5,799,110 and a continuation-in-part of U.S. patent application Ser. No. 08/555,435, filed Nov. 9, 1995, pending.

BACKGROUND OF THE INVENTION

1. Field of the Invention

The invention relates to a method and system for image compression and, more particularly, to a method and system for allocating bits for representing blocks that are transmitted in an image compression system.

2. State of the Art

Enormous numbers of bits are used to represent images in electronic form. Examples of such images are those used in video telephone systems and magnetic resonance imaging. Transmission of such electronic images over data lines, such as telephone lines, can take a significant amount of time. Further, storage of such data may take an enormous amount of memory.

Vector quantization (VQ) (a form of encoding) has been developed to reduce the number of data bits needed to represent an image. With a reduced number of data bits, the time to transmit the bits and the memory needed to store the data bits is also reduced. VQ deals with a block of samples (called a vector) at once, and as a result VQ has some performance advantages as compared with scalar quantization. VQ can be viewed as pattern matching, where input patterns or vectors are approximated by one of many stored patterns in a codebook. The resulting quantization error from such an approximation depends upon how well the stored patterns, referred to as codevectors, represent the input vectors. Consequently, codebook generation may be greatly improved by prior knowledge of the information source and is important to the performance of VQ.

Consider an image that is divided into numerous small areas called pixels (for picture element). Pixels are sufficiently small that the intensity of the image is approximately constant across the pixel area. For example, a black and white image of a house might be divided into a grid of 600 rows and 600 pixels per row. Each pixel would be like a small dot in the image. A block or group of pixels in the same region would form a vector which can be thought of as a small subimage. For example, a 6×6 square block of pixels forms a 36 element vector, which may be a portion of a shadow or part of the roof line against a light background.

Mean-removed VQ (MRVQ) is a special case of product codes. Product codes refer to a family of vector quantization methods in which one large codebook is replaced by more than one smaller codebook. As a result, the vector space represented by the overall quantizer is given as the Cartesian product of smaller vector spaces, and hence the name product codes. In MRVQ, the sample mean of each input vector is computed and then subtracted from every vector component. The resulting mean removed, or residual, vector is then vector quantized. The utility of MRVQ is that the residual vectors can be adequately represented with many fewer codevectors as compared to the original image vectors. The mean of each vector is also coded and included along with each codevector index. Since the mean is a scalar quantity, it is scalar quantized. As a result, the mean includes all of the possible quantization levels of the scalar quantizer. MRVQ can provide a significant reduction in the overall complexity of a VQ system as compared to direct VQ.

There are various well known forms of compression (e.g., discrete cosine transform) other than VQ.

SUMMARY OF THE INVENTION

The invention relates to a method and system for allocating bits for representing blocks that are transmitted in an image compression system. In a preferred embodiment, a video telephone communications system includes a video transmitting/receiving (transceiving) system including local and remote processing systems separated by a communications link. The local processing system determines indices to be sent to a remote processing system to represent the image.

Under one aspect of the invention, the local processing system determines an optimal bit allocation in which the following relationship may be minimized $DR=D+\lambda R$, where D is the total distortion $\Sigma d_i$ for a frame; $\lambda$ is a value determined as described below; $R=\Sigma r_i \approx R_d$ which is the desired total number of bits for the frame. The optimal bit allocation may determine $\lambda$ for an entire frame.

Under other aspects of the invention a lambda feedback technique, with or without predecision, may be used. The lambda feedback techniques may determine $\lambda$ block by block. Conditional update preselection and mode preselection are other reduced complexity procedures.

Various methods, including bisection and parallel methods, may be used to determine a $\lambda$ leading to the desired bit rate.

With a given $\lambda$, a bottom up method with partitions may be used with fixed block size VQ and hierarchical VQ to determine a minimum $DR=D+\lambda R$.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
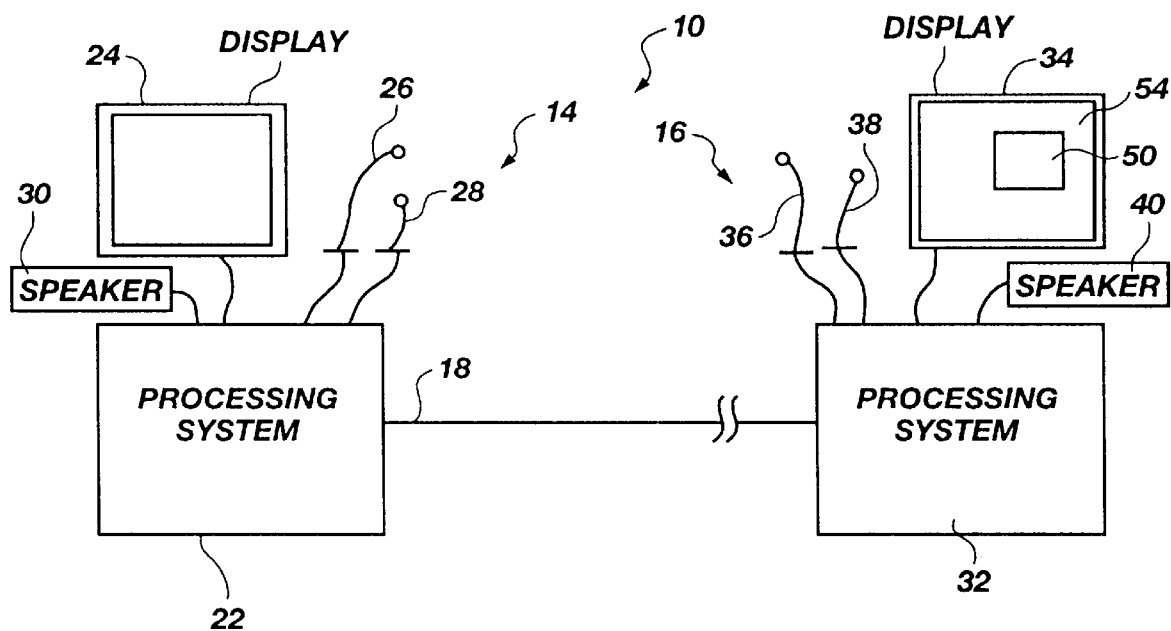
FIG. 1 shows a schematic block diagram representation of a video telephone communications system according to the present invention.

The following is a table of contents for the remainder of the specification:
A. System Overview
B. Bit Allocation
  1. Examples for Fixed Rate Image Coding of a Single Frame
     a. Bisection Method of Determining λ
     b. Parallel Method of Determining λ
  2. Lambda (λ) for Entire Frame: Additional Examples
     a. Fixed Block Size VQ for a Given λ
     b. Hierarchical VQ for a Given λ
     c. Sequence Image Coding
  3. Reduced Complexity
     a. λ computed for each block: Bit Allocation Using λ Feedback
     b. Conditional Update Preselection
     c. Mode Preselection
C. Additional Information and Variations A. System Overview Referring to FIG. 1, a video telephone communications system 10 includes a video transmitting/receiving (transceiving) system 14 and a video transmitting/receiving (transceiving) system 16 separated by a communications link(s) or channel(s) 18. Communications link 18 may be any of a variety of mediums including one or more of standard telephone lines, fibre-optic cable, microwave transmission, satellites, and associated circuitry. In the general case, a particular transceiving system may transmit data to a remote transceiving system through a variety of different mediums (and combinations of mediums) that transmit data at substantially different rates.

Video transceiving system 14 includes a processing system 22, display(s) 24, video camera(s) 26, microphone(s) 28, and speaker(s) 30. Video transceiving system 16 includes a processing system 32, display(s) 34, video camera(s) 36, microphone(s) 38, and speaker(s) 40. Displays 24 and 34 may be any of a variety of displays including cathode ray tube (CRT), liquid crystal (LCD), and plasma.

The term "local processing system" refers to a processing system that is local with respect to a point of reference. The term "remote processing system" refers to a processing system that is remote with respect to a point of reference. For example, processing system 22 is the local processing system for display 24. Processing system 22 is a remote processing system with respect to display 34 and transceiver 16 in general. For ease in description, transceiving system 14 will be referred to as the "local" transceiving system and transceiving system 16 will be referred to as the "remote" transceiving system, although which is local and which is remote is a matter of perspective.

Figure 2:
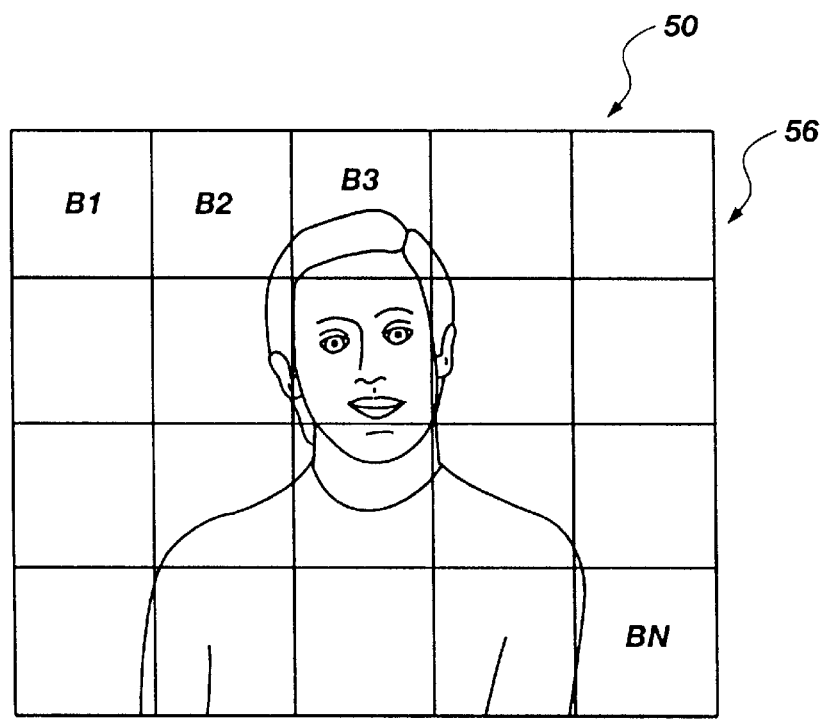
FIG. 2 shows a representative image on a screen as well as blocks in a frame.

Referring to FIGS. 1 and 2, a visual image 50 is produced on a screen 54 of display 34. Image 50 may occupy all of screen 54 or merely a portion of screen 54, as shown in FIG. 1. Depending on the transmission rates, a smaller image may provide noticeably better resolution. The screen may also provide control icons, and status information. The screen could also have an additional image(s) from, for example, one or more additional remote transceiving systems in conference call. One or more of the additional images could be objects from a remote location or local memory or CD showing an image, that may be discussed by those at remote locations.

Image 50 is the visual result of one or more frames of data being displayed on display 34. For simplicity, the following discussion will generally refer to only one frame per image, although those skilled in the art will readily appreciate its application to more than one frame (e.g. Y, U, and V frames) for producing color images. Image 50 may be the visual presentation of one of a series of frames, such that the image displayed after image 50 could differ from image 50. Alternatively, a single frame could be repeated such that image 50 would not vary over a certain period of time.

As a mental construct, a frame 56 is shown in FIG. 2, although it will be appreciated that in the circuitry and memory of processing systems 22 and 32, the frame is a large amount of data, generally in the form of high or low voltages. Frame 56 is divided into a series of blocks B1, B2, . . . , BN. The lines between blocks in FIG. 2 are only conceptual and are not part of image 50 or frame 56, and are not produced onto display 34.

For ease of illustration, frame 56 is shown as comprising 20 blocks, although the number of blocks could be greater or smaller. The blocks may be each 16 pixel ×16 pixel blocks, or some other size. It is not necessary that the blocks be all of the same size or have a length equal to a width. Although the blocks are numbered from left to right and from top to bottom in FIG. 2, various other orders could be used. In certain prototype experiments with a personal computer, eight horizontal 16×16 blocks and seven vertical 16×16 blocks were used. However, a much greater number of blocks may be used.

Generally speaking, image 50 and frame 56 originate in transceiver system 14 and are transmitted in coded form through communications link 18 to transceiver system 16. However, as is described in detail below, processing systems 22 and 32 are configured and programmed so that the images displayed on display 34 meet certain performance requirements. To meet the requirements, choices are made as to coding. The present invention concerns such choices. Some of the images displayed on display 34 may originate in memory, CD ROM, or another location, such as in a conference call. An image might be displayed on two or more screens at two or more remote locations for two or more persons to view and discuss.

In operation, blocks of frames are encoded or compressed through VQ or another form of data compression (e.g., discrete cosine transform (DCI)) in processing system 22 of transceiver 14. Indices representing the blocks are passed through communications link 18 to transceiver 16. The blocks are then decoded or decompressed in processing system 32, which has a copy of the codebook. (As described below, however, in some cases a frame is not compressed because a previous block may be reused.) In many, if not almost all cases, there is some difference between a frame prior to compression and the decompressed frame in both processing systems 22 and 32. This difference is measured in terms of distortion. There are various well known measures of distortion. For example, an L1 norm is shown in equation (1), below:

$$d(\overline{V}\text{input}, \overline{V}\text{cb}) = \sum_{i=1}^{k} |\text{Vinput}_i - \text{Vcb}_i|, \quad (1)$$

where $\overline{V}$input is a block before encoding, $\overline{V}$cb is a decoded block, each of dimension k, Vinput$_i$ is the ith pixel in $\overline{V}$input, and $Vcb_i$ is the ith pixel of $\overline{V}cb$. Other measures of distortion include the squared error distortion (L2), and L-infinite distortion measure.

The following definitions are used herein:

The "rate" is the number of bits/second transmitted between transceiver 14 and transceiver 16 on communications link 18.

The "bit rate" is the number of bits/frame, i.e., the number of bits included in representations of the frame (e.g., indices) that are transmitted over communications link 18 to indicate to processing system 32 what should be displayed on screen 54.

The "frame rate" is the number of frames per second that are displayed on screen 54.

Generally, there is an inverse relationship between bit rate and distortion. However, depending on their capability, processing system 22 and communications link 18 may not be able to supply a bit rate that produces a desired distortion level. A lower bit rate may produce a jerkier quality or a less sharp picture (which is a form of distortion). One aspect of the present invention involves providing a minimal or close to a minimal distortion for a given bit rate.

Figure 3:
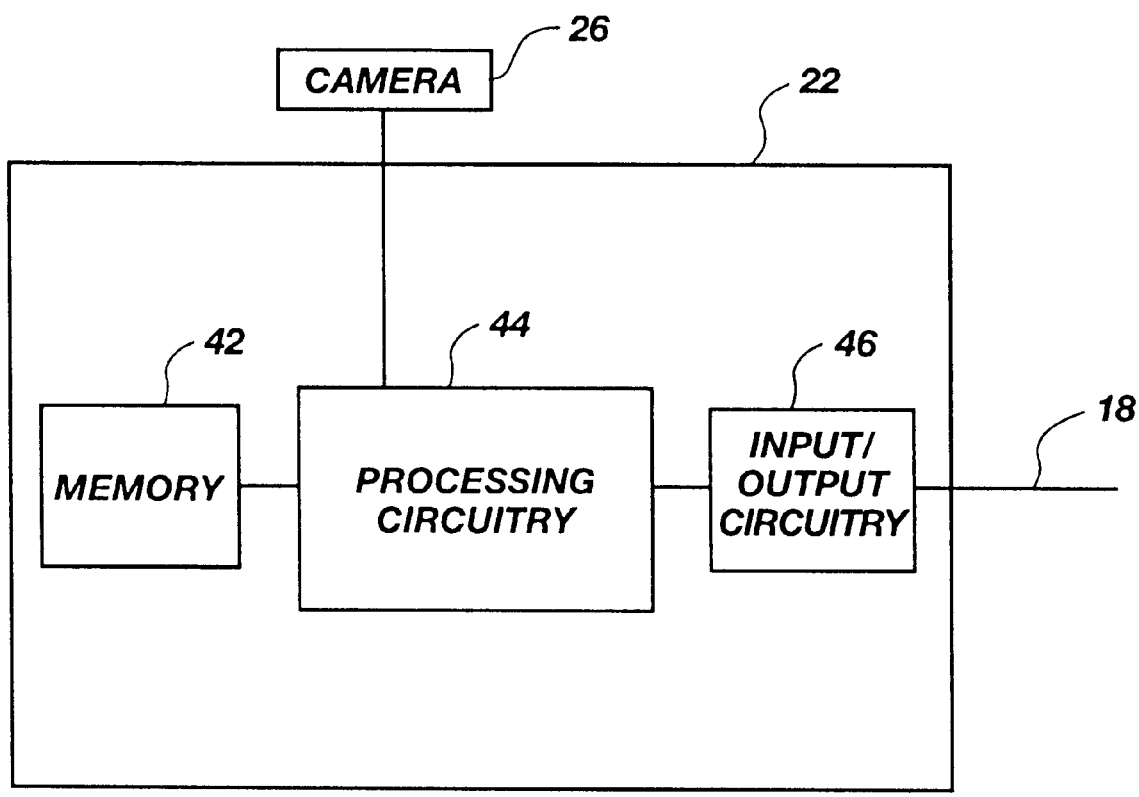
FIG. 3 is a block diagram representation of circuitry in one embodiment of a processing system.

Referring to FIG. 3, an embodiment of processing system 22 includes memory 42, processing circuitry 44, and input and output circuitry 46. Data from memory 42 (e.g. frames of data) are supplied to processing circuitry 44. Input and output circuitry 46 interfaces with communications link 18.

B. Bit Allocation

Equation (2), below, is involved in one technique for selecting a codevector that results in a minimum or close to minimum distortion at a particular bit rate:

$$DR = D + (\lambda \cdot R) = D + \lambda R \quad (2),$$

where DR is a symbol representing $D+\lambda R$ and which should be minimized; D is the total distortion $\Sigma d_i$ for a frame (where $d_i$ is the distortion of the ith block of the frame); $\lambda$ is a value determined as described below; and $R = \Sigma r_i \approx R_d$ which is the desired total number of bits for the frame (where $r_i$ is the number of bits for the ith block of the frame). The relationship $R = \Sigma r_i \approx R_d$ may be viewed as a constraint.

Figure 4A:
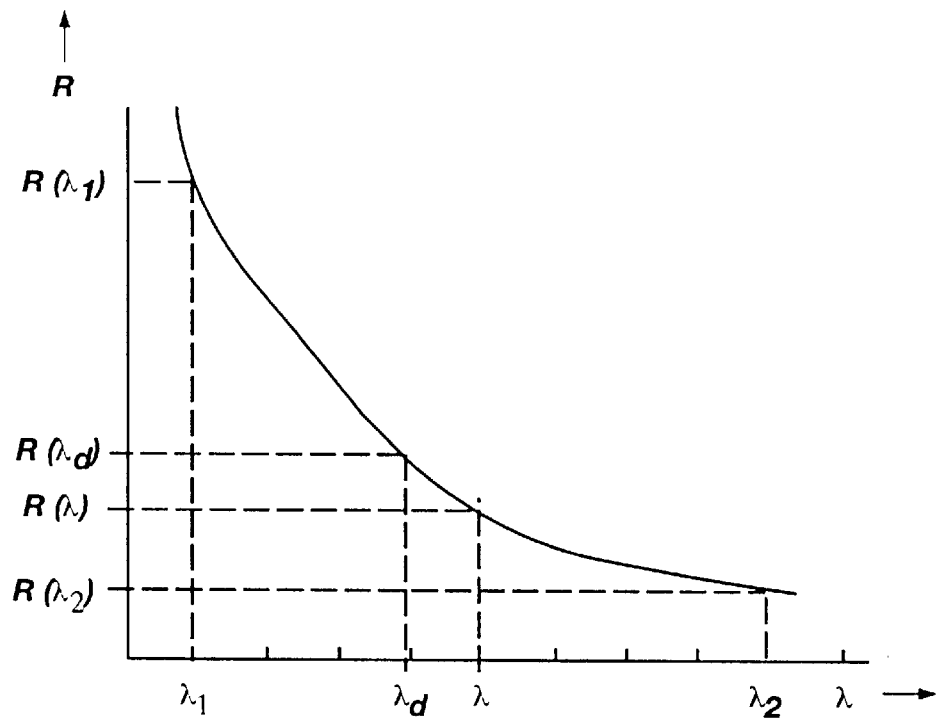
FIG. 4A shows a graphical representation of bit rate R as a function of $\lambda$.

The inverse relationship between bit rate (R) and $\lambda$ is illustrated generally in FIG. 4A, although the precise shape of the curve may be somewhat different. The curve would be shifted (and perhaps otherwise be different) with different images. Under a preferred procedure, the computer that calculates DR for a given $\lambda$ does not actually derive an entire R vs. $\lambda$ curve, but rather calculates $R(\lambda)$ at different points of $\lambda$.

1. Examples for fixed rate image coding of a single frame

In fixed rate image coding, a fixed number of bits is used to encode an image. An optimal bit allocation algorithm can optimally distribute the given bits to each block of the frame such that the total distortion is a minimum. As used herein, the term optimal is somewhat relative and depends on what is considered and desired. For example, one optimal solution may be found considering an entire frame. A different optimal solution may be found considering only a block. Still another optimal solution may be found considering several frames. Each has tradeoffs of performance and requirements.

Minimizing $(d_i+\lambda r_i)$ for each block provides the same result as minimizing $(D+\lambda R)$ for the frame. Therefore, the optimization procedure may involve finding a $\lambda$ such that $(d_i+\lambda r_i)$ is minimized for each block and the sum of $r_i$ approaches $R_d$. The block rate, $r_i$, is the required number of bits for the ith block that minimizes the $(d_i+\lambda r_i)$ value.

The formula $D+\lambda R$ may be simulated with fixed point precision. The parameter D may be any of various distortion measures for a given block (also called a vector), with the L1 distortion being an example. The parameter R may be the actual number of bits used for a given block. That is, R may be the summation of the overhead used in identifying the block size, the number of bits used in block type, the actual number of bits used in mean (e.g., Huffman coded,) the actual number of bits used in stage and the number of bits used in VQ index. Merely as an example, the parameter R may be a fix-point value with 1/32 precision.

There are various methods or techniques that may be used to find $\lambda$. Some of these techniques are described below.

a. Bisection method of determining $\lambda$

The bit rate R is a monotonic non-increasing function of $\lambda$, that is, $R(\lambda) \geq R(\lambda+\epsilon)$ for any $\epsilon > 0$. Accordingly, a bisection method that includes the following steps (a) through (f) may be used to identify a $\lambda$ that produces a $R(\lambda)$ that is within an acceptable range of an $R(\lambda_D)$, where $R(\lambda_D) = R_d$, the specified bit rate.

Step (a): Pick initial $\lambda_1$ and $\lambda_2$, such that $R(\lambda_1) > R_d > R(\lambda_2)$, where $\lambda_1 < \lambda_2$. This may be done by picking the initial $\lambda_1$ and $\lambda_2$ at relatively low and high values.

Step (b): Calculate $\lambda = (\lambda_1 + \lambda_2)/2$.

Step (c): Determine the minimum $(d_i+\lambda r_i)$ for each block in the frame by encoding each block for each bit rate and determine the resulting distortion through, for example, the L1 norm.

Step (d): Calculate $R(\lambda) = \Sigma r_i$, for i=1 to N, where $r_i$ is the $r_i$ from the minimum $(d_i+\lambda r_i)$ for block i.

Step (e):

If $R(\lambda)$ is within an acceptable range of $R_d$, then that $\lambda$ is used for the frame.

If $R(\lambda)$ is greater than an acceptable range of $R_d$, then $\lambda_1 = \lambda$. Go to step (b).

If $R(\lambda)$ is less than an acceptable range of $R_d$, then $\lambda_2 = \lambda$. Go to step (b).

There are different methods for determining whether $R(\lambda)$ is within an acceptable range of $R_d$. For example, it could be determined whether the condition $|(R_d - R(\lambda))/R(\lambda)| <$ Threshold1 is met, where Threshold1 may be selectable by the user. Alternatively, it could be determined whether the condition $|R_d - R(\lambda)| <$ Threshold2, where Threshold2 may be selectable by the user and may be different from Threshold1. It is noted that the threshold may be zero, particularly if the numbers are rounded and do not have a great deal of precision. Further, it is not important whether a greater than or greater than or equal to relationship or a less than or less than or equal to relationship is used.

Step (f): Send the index or indices associated with the minimum $(d_i+\lambda r_i)$ identified in step (c) through communications link(s) 18 to the remote transceiver. The index will be the one corresponding to the codevector that resulted in the minimum $(d_i+\lambda r_i)$. It is expected that the index will include a header or other bits, which are well known in communication techniques, indicating a level of the codebook.

Example of steps (a) through (e)

Figure 4B:
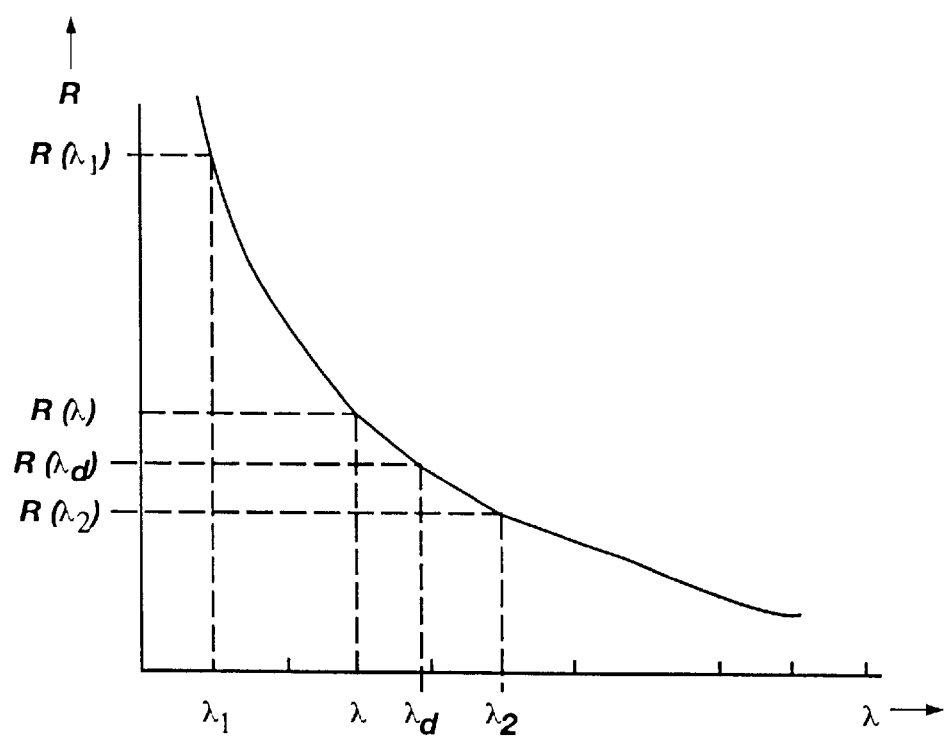
FIG. 4B shows a graphical representation of bit rate R as a function of $\lambda$, which is a continuation of a process represented in FIG. 4A.

With reference to FIG. 4A and 4B, $\lambda_1$ and $\lambda_2$ are chosen according to step (a). $A\lambda = (\lambda_1 + \lambda_2)/2$ is determined according to step (b). In the example, each block is a 16×16 block. A three-level tree search codebook is used in which level 1 has 16 codevectors, level 2 as 256 (=16·16) codevectors, and level 3 has 4096(=16·16 ·16) codevectors. In the example, two bits are used to indicate the level. "00" represents level 1, "01" represents level 2, and "10" represents level 3. Therefore, at level 1, the bit rate $r_1$ would be 4+2=6 bits, where 2 bits indicate the level. (It is noted that $2^4=16$.) At level 2, the bit rate $r_2$ would be $8+2=10$ bits. (It is noted that $4+4=8$.) At level 3, the bit rate $r_3$ would be $12+2=14$ bits. (It is noted that $4+4+4=12$.)

DR is determined according to equation (2) for each level at each $\lambda$, where $R(\lambda)$ is within an acceptable threshold of $R_d$. Merely as an example, if $\lambda=10$, and $d_{i1}=200$, $d_{i2}=150$, and $d_{i3}=120$, the DR values for levels 1, 2, and 3 would be as follows:

DR=$d_{i1}+\lambda_{10}r_{i1}$=200+(10·6)=260     Level 1:

DR=$d_{i2}+\lambda_{10}r_{i2}$=150+(10·10)=250   Level 2:

DR=$d_{i3}+\lambda_{10}r_{i3}$=120+(10·14)=260   Level 3:

In this example, the codevector (or block) at level 2 produces the minimum $d_i+\lambda r_i$, for one block of blocks 1 through N.

According to steps (c) and (d), $R(\lambda)=\Sigma r_i$, where $r_i$ is the $r_i$ for the minimum $(d_i+\lambda r_i)$ of block i. However, $R(\lambda)$ is less than an acceptable range of $R_d$, and therefore $\lambda_2=\lambda$, according to step (e) and is shown in FIG. 4B. Under step (d), $R(\lambda)>R_d$, and therefore $\lambda_1=\lambda$ and step (b) is repeated. Through continued iteration, eventually, $R(\lambda)$ is within the acceptable range of $R_d$, and $\lambda=\lambda_d$.

Multi-stage VQ rather than tree-structured VQ will also work effectively. For example, a multi-stage VQ system with six stages and four bits per stage may be employed. A multi-stage tree-structured VQ may also be used. Tree-structured VQ tends to create less distortion and may require fewer bits to transmit over the communications link than does multi-stage VQ, but tree-structured VQ also takes more memory than does multi-stage VQ. In many circumstances, the amount of memory used may not be important. However, where the invention is employed in a home computer, the amount of memory used may be an important consideration. However, as performance of home computers continues to improve, the memory used may be less important.

In a multi-stage algorithm, VQ is performed on an image or other signal and then $VQ^{-1}$ is performed. An $error_1$ is the difference between the input to VQ and the output of $VQ^{-1}$ in a well known manner. If $error_1$ <(or $\leq$) Threshold, the VQ is complete. Otherwise, VQ is performed on $error_1$ and then $VQ^{-1}$ is performed. An $error_2$ is the difference between the input of VQ and the output of $VQ^{-1}$. If $error_2$ <(or $\leq$) Threshold, VQ is complete. Otherwise, VQ is performed on $error_2$ and so forth.

The bisection method is an iterative sequential method to find the optimal $\lambda$. However this method can not guarantee a reasonable solution in a few fixed number of iterations.

b. Parallel method of determining $\lambda$

A parallel method may be used to solve this problem and is described as follows. The entire possible range of $\lambda$ is divided into N+1 regions, such that N$\lambda$s are selected. For each of these N$\lambda$s, a minimum DR value and the corresponding trial $R_d$ are found under a procedure like that of the bi-section method, but over a smaller range. The region which has the closest bit rate to $R_d$ is chosen as the region for the next processing iteration. The region chosen for the next processing iteration is evenly divided into N+1 regions and the same processing is repeated to find a region which has the closest rate to $R_d$. The same procedure for successive iterations can be repeated until the difference between the final bit rate found and $R_d$ is small enough. For each iteration, there are N$\lambda$s used in parallel to find the best trial $R_d$. If i iterations are required, then the final result is obtained by doing i·N times computations, which is the same as the result obtained by doing $N^i$ times computations. Eight parallel processors with three iterations may be acceptable for some circumstances. The parallel processors may be inexpensive, and implemented in a VLSI chip such that real time compression is practical.

In order to solve the entire optimal bit allocation problem using the bisection method or the parallel approach, for any given $\lambda$, the minimum value of $(d_i+\lambda r_i)$ for each block is found first.

The optimal bit allocation methods can be applied to different VQ algorithms, such as multi-stage VQ, tree-structured VQ, multi-stage tree-structured VQ, fixed size VQ, hierarchical VQ, gain shape VQ, product VQ, etc., or combinations of them. The way to find the minimum value of $(d_i+\lambda r_i)$ for various VQ algorithms is described below. The simplest case using fixed size VQ is presented first, followed by hierarchical VQ, and hierarchical VQ on sequence image coding.

The above-recited methods were described in connection with determining a single $\lambda$ for the entire frame. In such a case, the bit rate of each block may vary, but in a way that achieves a particular bit rate R for the entire frame.

2. Lambda ($\lambda$) for Entire Frame: Additional Examples

The above-recited methods were described in connection with a still frame image. However, most images are part of a series of images (from a series of frames) that typically change at least some what from frame to frame. This may be referred to as sequence image coding. The following describes techniques for sequence image coding. The above-recited methods to determine $\lambda$ and optimization, as well as additional techniques described below, may be used in connection with sequence image coding.

a. Fixed Block Size VQ for a Given $\lambda$

An image for a frame may be partitioned into blocks of fixed size. The codebook can be, for example, a tree-structured codebook, a multi-stage codebook, or a multi-stage tree-structured codebook, etc. Depending on the given $\lambda$, each block can be coded to any single level (i.e. fixed size) between the top and the bottom levels. To find the minimum $(d_i+\lambda r_i)$ value for each block, each block may be encoded from the top to the bottom level. The distortion and the bits used for each level is recorded. Since $\lambda$ is given, the minimum value of $(d_i+\lambda r_i)$ can be found among the different levels from the top level to the bottom level.

b. Hierarchical VQ For a Given $\lambda$

In hierarchical VQ (also called HVQ), the image of a frame may be partitioned into large fixed size blocks. Each block can be partitioned into different block sizes and encoded using codebooks for different block sizes. Assuming that each block is 16×16, each 16×16 block can be encoded using different block sizes. The dimensions used may include 256 (e.g. 16×16), 128 (e.g. 16×8), 64 (e.g. 8×8), 32 (e.g. 8×4), 16 (e.g. 4×4), and 8 (e.g. 4×2). There may be different codebooks corresponding to each block size.

The bottom-up method may be used to find the minimum DR value for each block. Under the bottom-up method, the smallest block size is considered first. Each block is first partitioned into each different block size and each block is then encoded from top to bottom levels. The distortions and the bits used for each block at each different level are recorded.

In Steps (a) through (e), below, an example of a bottom-up method is described as follows for each 16×16 block in the frame (image):

Step (a): Find the minimum DR value for each block of size 8 (e.g., 4×2) in the 16×16 block.

Step (b): Find the minimum DR value for each block of size 16 in the 16×16 block. Each block of size 16 can be broken into two blocks of size 8. Compare the minimum DR value of each block of size 16 with the sum of two minimum DR values of block sizes 8, which are sub-blocks of the block of size 16. If the minimum DR value of block size 16 is larger, then substitute the minimum value with the sum of two minimum DR values. This means that the block of size 16 should be broken into two blocks of size 8. Otherwise, the minimum DR value of block size 16 is unchanged, which means the block should not be broken into two blocks.

Step (c): The same processes performed in step (b) are repeated for each block of size 32 to determine the partition of the block of size 32.

Step (d): The same processes are performed on the block of size 64, followed by blocks of sizes 128 and 256.

Step (e): Once the block of size 256 is processed, a partition tree is built which shows how the 16×16 block is partitioned.

Hierarchical VQ is particularly beneficial when there are high levels of detail. In such cases, a greater number of bits are concentrated for smaller block sizes where there are high levels of detail. However, a smaller number of bits are used in areas of lower levels of detail. As such, the bits allocation leads to a better combination of distortion and bit rate (e.g. less distortion for the same bit rate than the same technique without hierarchical VQ).

c. Sequence Image Coding

In sequence image coding, a motion compensation technique may be used to remove the temporal redundancy. That is, in the case of many, if not almost all, images, certain portions of the image do not change in successive images. For example, in the case of a video telephone, a person talking may move, but most of the background remains constant in successive frames of images.

Figure 5A:
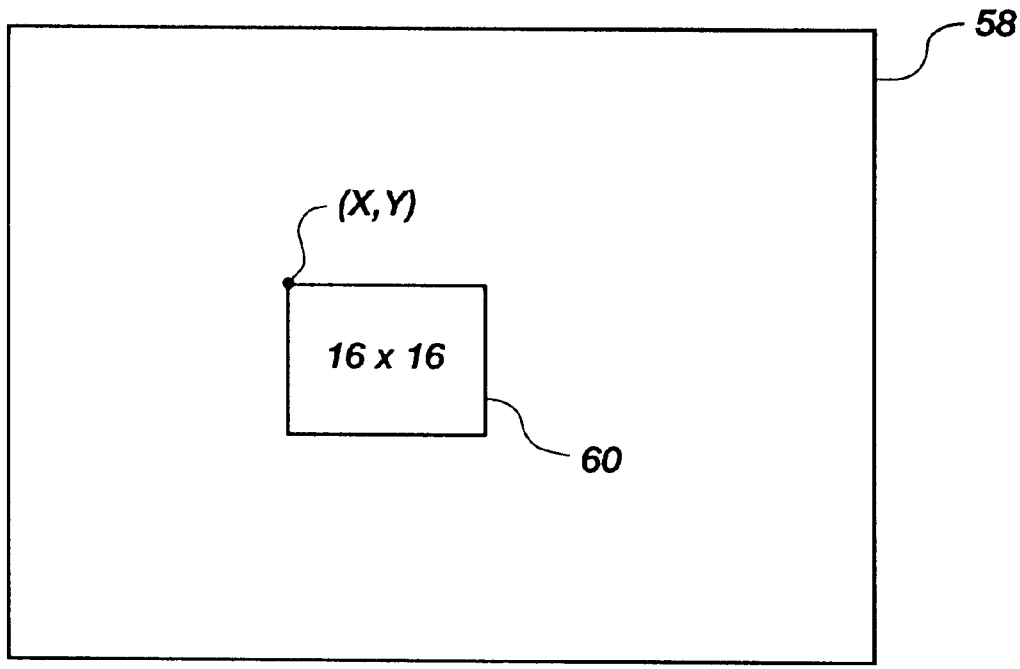
FIG. 5A is a representation of a current frame including a current block.
Figure 5B:
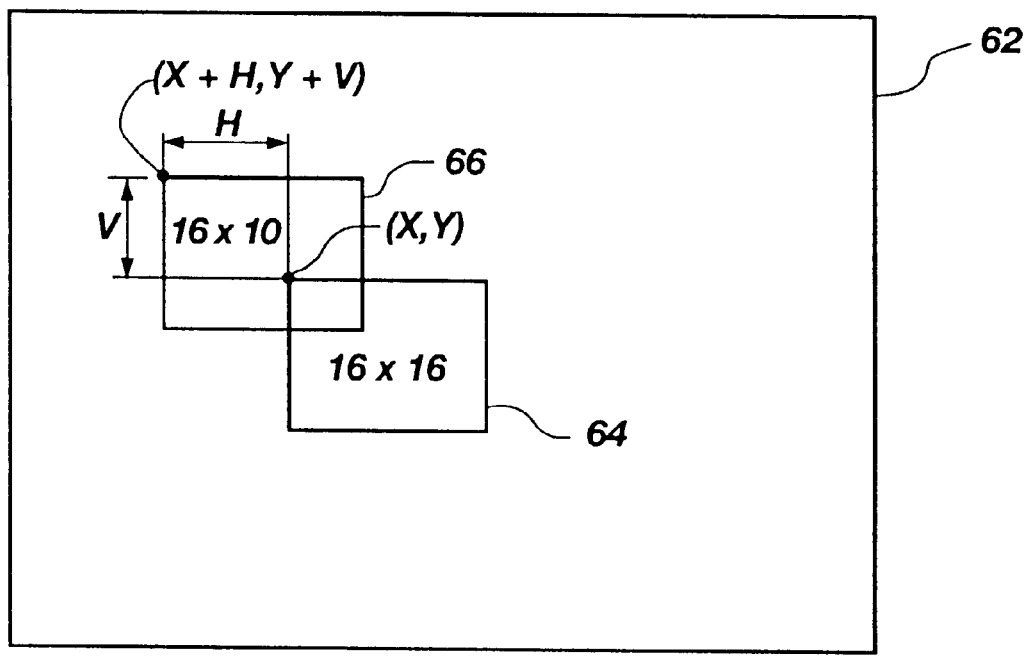
FIG. 5B is a representation of a previous frame including a motion estimated block and a conditional previous block.

FIGS. 5A and 5B are useful in explaining techniques for sequence coding. FIG. 5A shows a current frame 58 which includes a 16×16 current block 60. The size of 16×16 current block 60 may be exaggerated with respect to current frame 58 for illustration purposes. The location of blocks may be identified by a single designation pixel, which may be at the upper, left hand corner of the block. For example, the location of current block 60 is identified by a designation pixel (X, Y).

FIG. 5B shows a previous frame 62 which includes a 16×16 conditional previous block 64 and a 16×16 motion estimated block 66. The sizes of blocks 64 and 66 may be exaggerated with respect to previous frame 62 for illustration purposes. The designation pixel of conditional previous block 64 is (X, Y) and therefore occupies the same location in previous frame 62 that current block 60 occupies in current frame 58.

The designation pixel of motion estimated block 66 is (X+H, Y+V), where H is the horizontal displacement vector and V is the vertical displacement vector between designation pixels of motion estimated block 66 and current block 60. Note that H and V each may be either positive or negative numbers. The location of the block which is determined to be motion estimated block 66 is made through well known techniques.

To implement the following motion compensation modes, the local processing system assembles a previous frame, ideally identical to that assembled in the remote processing system. The previous frame may be assembled through a decoder (or decompressor) and memory.

Under one block matching motion compensation approach, the current frame is divided into blocks of fixed size. The block size of 16×16 has been used in simulation. For each block in the current frame, a representative block found in a certain range of the previous decompressed frame is used to represent the block. The representative block may be conditional previous block 64 or a motion estimated block 66. Under one embodiment of the invention, if the representative block is not acceptable, a motion compensated residual block, which is the difference between the current and the representative block, can be further coded. Under a preferred embodiment, the value of DR controls which mode is chosen.

System 10 may operate in various modes including the following: (1) Intra Block Mode (also called Nonmotion VQ mode), (2) Motion Compensation Mode (or Inter Mode), and (3) Conditional Update Mode. To prevent error accumulation, every X number of frames, the system initiates a Forced Intra Block Mode regardless of whether a motion compensation mode or conditional update mode is otherwise indicated.

(1) Intra Block Mode

In Intra Block Mode, also called Nonmotion VQ Mode, the local processing system of system 10 performs VQ on current block 60 and passes indices over the communication link to the remote processing system. The compressed data is recovered through decoding in the remote processing system and the block is positioned in the current frame in the remote processing system. This mode is performed when current block 60 is significantly different from the representative block of the previous frame.

(2) Motion Compensation Mode

Motion Compensation Mode (also called Inter Block Mode) may work in one of two ways. If the difference between current block 60 and the representative block of the previous frame is below a threshold, then the local processing system may send only bits representing a motion displacement vector (H, V) (along with other standard, well known bits) to the remote processing system. If the difference between current block 60 and the representative block of the previous frame are not below the threshold, the local processing system performs VQ on the residual between current block 60 and the representative block (e.g. motion estimated block 66) and sends those VQ indices and the displacement vectors (H, V) to the remote processing system. The remote processing system then decompresses the residual and adds it to the motion estimated block of the previous frame in the processing system. The motion estimated block of the previous frame is identified by X+H and Y+V. (The previous frame is stored in both the local and the remote processing systems of system 10.) The current block of the current frame in the remote processing system then becomes the sum of the decompressed residual and the motion estimated block.

The block matching motion compensation algorithm may be performed with a fixed block size. The idea of hierarchical motion compensation is very similar to the idea of hierarchical vector quantization. The current frame is partitioned into blocks of a fixed size. Each block can be further partitioned into smaller sub-blocks. In the simulation, the image is divided into 16×16 blocks, each 16×16 block can also be further divided into four 8×8 blocks. A 16×16 block divided into four 8×8 sub-blocks and performing the motion estimation for each 8×8 sub-block separately can obtain a better predicted block than performing the motion estimation on the 16×16 block. However, four 8×8 sub-blocks need 4 motion displacement vectors and one 16×16 block only needs one motion displacement vector (H, V), which means that more processing capability overhead is needed. Four 8×8 sub-blocks requires more bits, but provides less distortion than one 16×16 block.

(3) Conditional Update Mode

Conditional Update Mode is used where there is no motion between a portion of the current and previous frame. The local processing system sends bits (e.g. one or two) to the remote processing system which are interpreted to mean that the current block of the current frame in the remote processing system should have the data of conditional previous block 64. Conditional previous block 64 is the block in the previous frame of the remote encoder with designation pixel (X, Y). It is not necessary to send blocks of the stationary regions.

In many cases, there is no motion in a block of an image. In other cases, an acceptable motion estimated block 66 cannot be identified although there is motion. In one embodiment of the invention, the minimum DR determines the course of action. In another embodiment, where there is no motion, Conditional Previous Mode is selected, and if there is motion, but no acceptable motion estimated block 66 is identified, than Intra Block Mode is selected. The local processing system 22 may first evaluate whether conditional previous block 64 is essentially identical to current block 60, prior to attempting to locate motion estimated block 66. If conditional previous block 64 is essentially identical to current block 60, then it may be unnecessary to identify motion estimated block 66.

Each block may be coded in one of the four above-mentioned coding modes (including 16×16 and 8×8 has separate modes). The optimal bit allocation can optimally determine the coding mode for each block. If the block is an intra block or a motion compensated residual block, the optimal bit allocation can make an optimal decision of how the block is vector quantized. Before doing optimal bit allocation, each block is coded using Intra Block Mode, Motion Compensated Mode, and Conditional Update Mode. The distortions and bits used in each different case are recorded. The same bottom-up method, described above, is used to find the minimum DR values for blocks of Intra Block Mode and Motion Compensated Mode. The minimum DR value, considering four modes, is chosen as the minimum DR value for the block.

In summary, the four coding modes are listed as follows:
a) Intra Block Mode (No Motion)
b) One 16×16 block Motion Compensation Mode
c) Four 8×8 blocks Motion Compensation Mode
d) Conditional Update Block Mode The optimal bit allocation with hierarchical motion compensation is very similar to the optimal bit allocation with fixed block size motion compensation, except an 8×8 motion compensation mode is added. The computation complexity is increased because the 8×8 motion estimation block and vector quantizing the 16×16 residual block which is obtained from the motion compensation of four 8×8 sub-blocks are required. The same bottom-up method discussed before is used to find minimum DR value for each block. The same optimal bit allocation is used to determine how each block is coded.

A header (e.g. two bit), or other portion of an index, may indicate which mode is used.

The following procedure may be used in connection with these coding modes. For each coding mode (i.e. a), b), c) and d)), a value of DR is computed for a particular $\lambda$ for each block in the frame of interest. For each block, there is an r (bit rate) associated with the minimum DR of the four modes. A bit rate for the entire frame is the sum of the bit rates associated with the minimum DR for each block (i.e. $R=\Sigma r$). The bisection or parallel technique may be used in selecting a $\lambda$ that results in $R(\lambda)=R_d$. Also, hierarchical VQ may be computed in combination with the modes.

The blocks associated with the minimum DR such that $R(\lambda)=R_d$ are the blocks that are represented in bits transmitted over the communication link. For example, if a) Intra Block Mode (No Motion) yields the minimum DR (of the four modes) for a particular block, then indices associated with the block of the codebook yielding that DR are sent over the communication link. If b) 16×16 block Motion Compensation Mode or c) Four 8×8 blocks Motion Compensation Mode yields the minimum DR (of the four modes) for a particular block, then bits representing displacement vectors H and V, and indices associated with the residual block are sent over the communication link. Finally, if d) Conditional Update Block Mode yields the minimum DR (of the four modes) for a particular block, then bits are sent over the communication link indicating that the previous block is used. Note that the remote processing system has a decompressed previous frame for use in connection with modes b), c) and d).

This technique may be used with less than all four modes (e.g. only modes a), b), and d)). The technique may also be used with all four or less than all four of modes a)–d) in combination with additional modes.

Choosing between the modes is an example of predecision.

Figure 6:
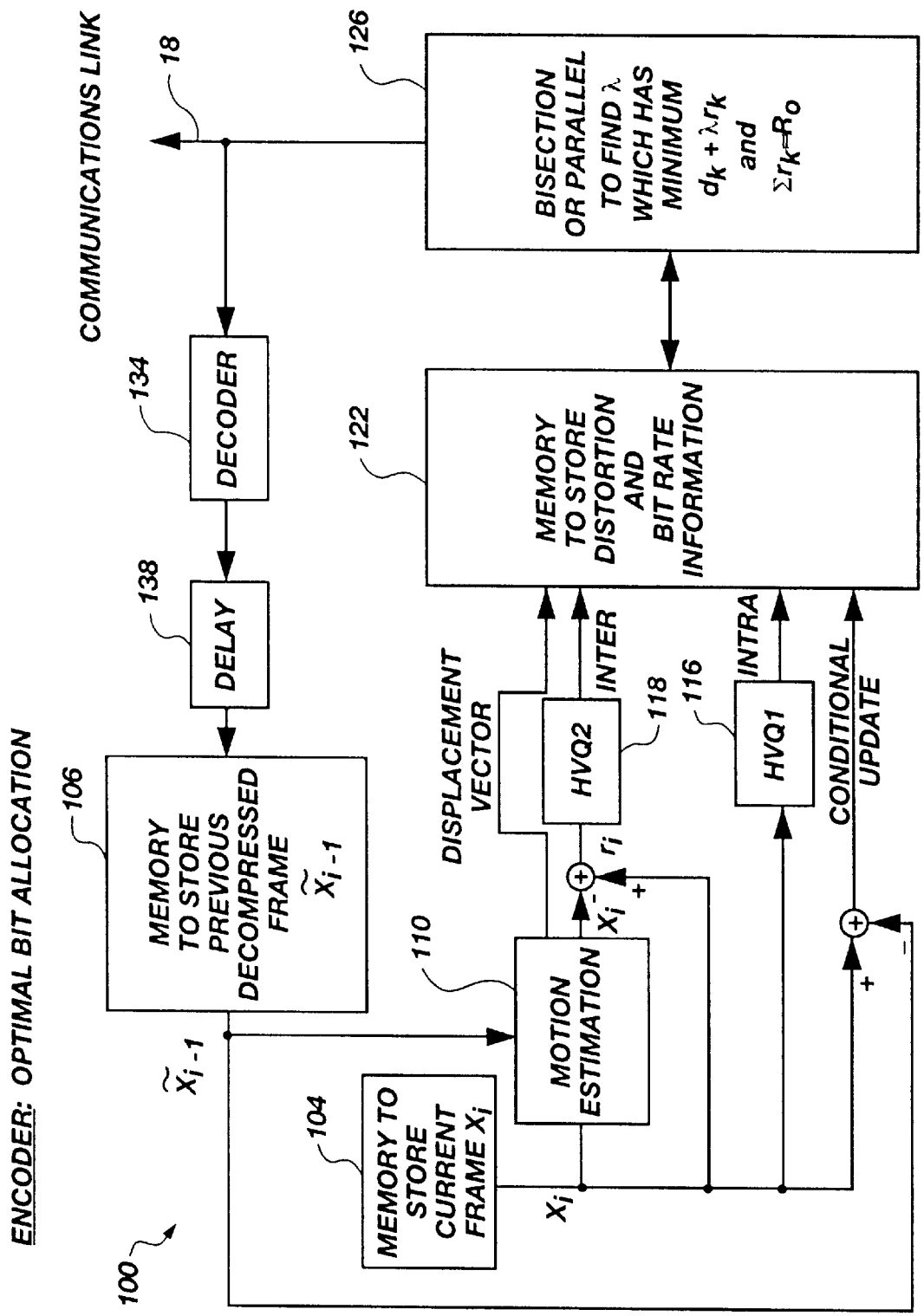
FIG. 6 is a block diagram representation of an image coding system and algorithms illustrating certain features of the invention.

FIG. 6 illustrates an exemplary simplified block diagram for an encoder 100 used in optimal bit allocation that illustrates certain of the above-described features, as well as additional information. Encoder 100 may be included in local processing system 22, which may include other circuits in addition. To distinguish between "blocks" of an image and "Blocks" of a block diagram, Blocks in a block diagram are capitalized. The Blocks may be implemented in software and/or hardware, such as dedicated hardware.

Referring to FIG. 6, memory Blocks 104 and 106 may be in RAM. A Motion Estimation Block 110 selects a motion estimated block, which is compared to the current block to obtain a residual. The current block is applied to a HVQ1 (hierarchical VQ) Block 116. The residual is applied to an HVQ2 Block 118. The output of HVQ1 or HVQ2 may be selected based on which has the lower DR or on another criterion, such as their relationship to a threshold. Memory Block 122 stores distortion and bit rate information and displacement vectors H and V. Lambda Determining Block 126 determines which codevector (or other appropriate representation, e.g. conditional update) is associated with the lowest $\lambda$. Bits representing the codevector, conditional update, displacement vectors H and V, and/or residual block are sent to communications link 18 and a decoder 134. Decoder 134 is preferably internal to local processing system 22. Another similar decoder is contained in remote processing system 32. A delay Block 138, which is preferably some sort of memory, provides a delay while the current frame becomes the previous frame.

Figure 7:
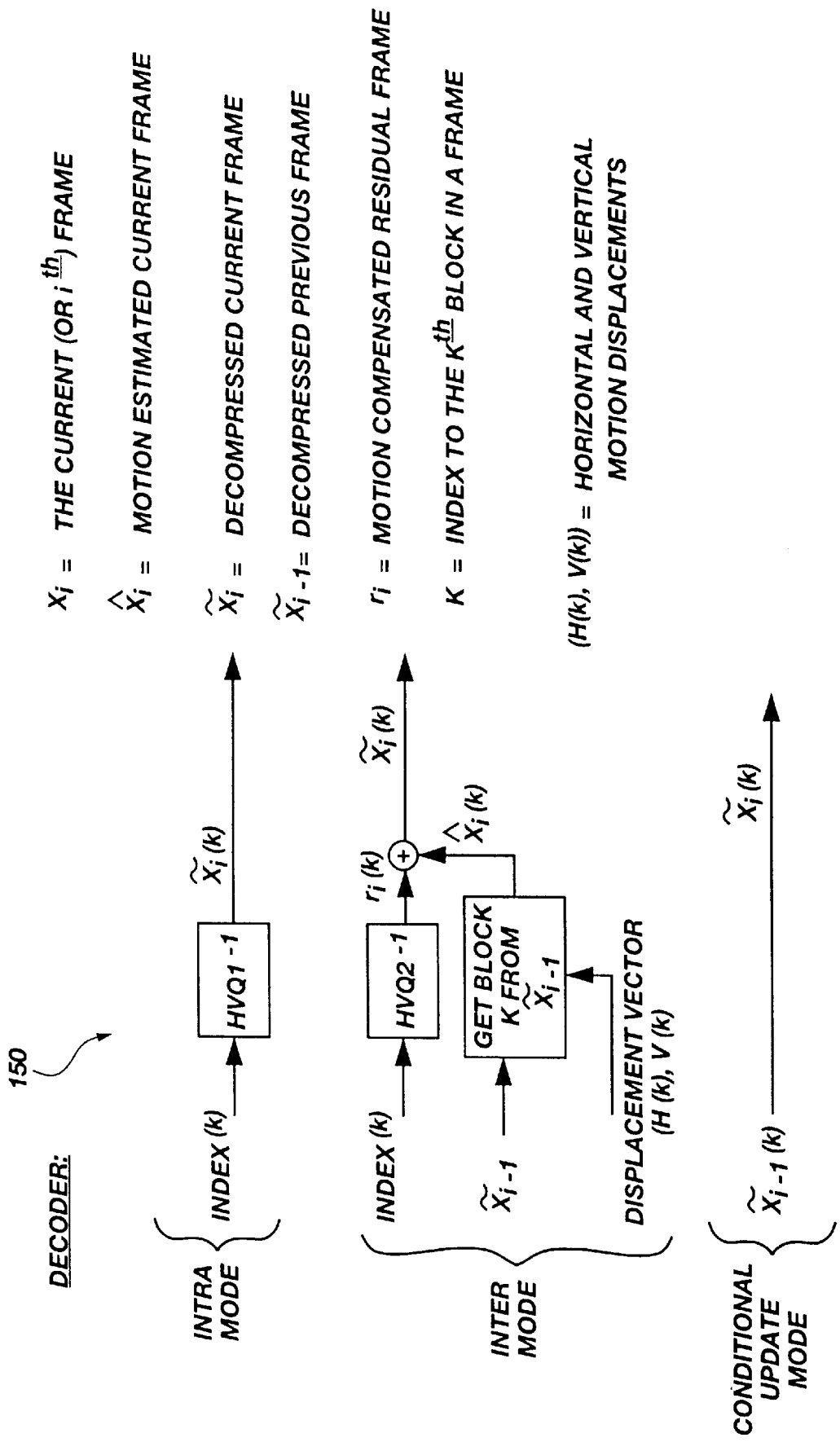
FIG. 7 is a block diagram representation of a decoder.

FIG. 7 illustrates an exemplary simplified block diagram for a decoder 150. A similar decoder may be used in remote processing circuitry 32 on the other side of communications link 18.

A legend for symbols in FIGS. 6 and 7 is shown next to FIG. 7.

3. Reduced Complexity a. $\lambda$ Computed for Each Block: Bit Allocation Using $\lambda$ Feedback In the above-described techniques, the value of $\lambda$ is determined by using all or much of the information in an image. In another technique, referred to as lambda feedback, the value of $\lambda$ is determined by using all or much of the information in a block. Lambda feedback may be used in connection with hierarchical VQ with bit allocation. Lambda feedback may be accomplished in a variety of ways.

A buffer fullness and distortion feedback method (also called lambda feedback) may be used to determine the $\lambda$ value for each block. Once $\lambda$ is computed for that block, the block leading to the lowest DR is represented by bits on the communication link. The calculated $\lambda$ may be used in connection with the four modes a)–d) described in the previous section, other modes, with hierarchical VQ, or various other techniques (such as compression other than VQ).

The following are versions of computing $\lambda$ with the buffer fullness and distortion feedback method.

Regarding the luminance component, let fdist be the average L1 norm of the motion 16×16 or 8×8 residual blocks for all blocks on the previous frame; buflevel be the current buffer size; maxbuf be the maximum buffer size, and bpv is the average number of bits allocated to a block. With respect to bpv, for example, if 2000 bits are allocated for a frame, and there are 20 blocks per frame, then bvp=2000/20=100 bits per block.

As an alternative, fist may be determined as follows. For frame 1, fdist1=1, and Avg1 equals the distortion of frame 1. For frame 2, fdist2=Avg1, and Avg2 equals the distortion of frame 2. For frame 3, fdist3=(fdist2+Avg2)/2, and Avg3 equals the distortion of frame 3. For frame i, fdisti=(fdisti-1+Avgi-1)/2.

Merely as an example, a relationship between the buffer fullness and the $\lambda$ value for the luminance component is provided in equation (3), below:

$$\lambda = \text{fdist}\left(\frac{1}{\text{bpv}} + \frac{10(\text{buflevel} + \text{bufoffset})}{\text{maxbuf}}\right), \quad (3)$$

where bufoffset is the buffer offset value.

The value of bufoffset is provided in the following formula in pseudo code in which nfrm is the input frame number and nfrm=0 is the first frame in the sequence:

If (nfrm < 20)

$$\text{bufoffset} = \text{maxbuf}\frac{(20 - \text{nrfm})}{10\text{bpv}},$$

else bufoffset = 0.

Merely as an example, for the chrominance components, $\lambda$ value may be calculated according to equation (4), below:

$$\lambda = \text{LAfdist}\left(\frac{1}{\text{bpv}} + \frac{10\text{buflevel} + 2\text{bufoffset}}{\text{maxbuf}}\right), \quad (4)$$

where LA is initialized to be one and updated in every five frames. Merely as an example, the value of LA may be updated according to the following procedure provided in psuedocode:

If (Ubits/Ybits<0.4)

LA=LA/1.2;

if (Ubits/Ybits>1.2)

LA=1.2LA, where Ybits is the average bits used per block for the last five Y frames and Ubits is the average bits used per block for the last five U frames. The adjustment of LA is a long-term adjustment on the bits used in luminance and chroma components.

Other functions of distortion, buffer level, and bit rate may be employed.

If the luminance Y frame has a relatively small number of bits, then it is desirable that the chrominance frame also have a relatively small number of bits.

As an example, the value of $\lambda$ may be further refined by the following procedure expressed in pseudo-code as follows:

if (Tbit<0.75 Abit)

$\lambda$=2.1$\lambda$;

if (Tbit>1.5 Abit)

$\lambda$=$\lambda$/1.2;

where Tbit is the total number of bits used in the luminance frame (Y frame) and Abit is the number of target bits allocated in the Y frame. The first condition states that when Y frame uses less bits than the target bits, the chroma frames should also use less bits than the target bits. (Increasing $\lambda$ will decrease the used bits.) The second condition states that when Y frame uses more bits, the chroma should also use more bits. The imposed conditions are to ensure consistency between the luminance frame and the chroma frames. This is a short-term adjustment on the bits used in luminance and chroma components.

Figure 8:
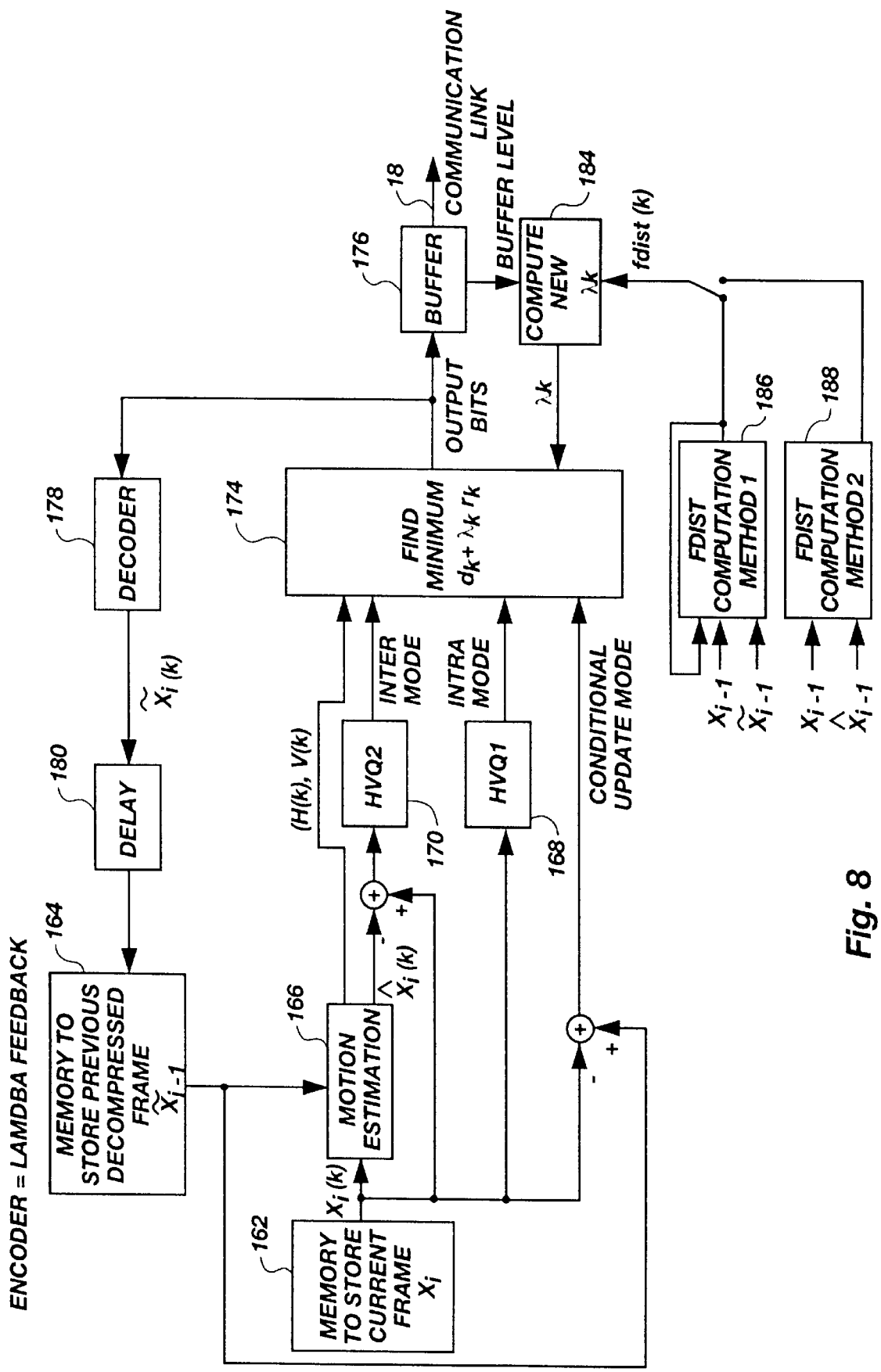
FIG. 8 is a block diagram representation of a sequence image coding system and algorithms illustrating certain features of the invention.

FIG. 8 illustrates an exemplary simplified block diagram for an encoder 160 used in lambda feedback and illustrates certain of the above-described features, as well as additional information. Encoder 160 may be included in local processing system 22, which may include other circuits in addition. The same symbols are used as in FIGS. 6 and 7. Memory Blocks 162 and 164 may be the same as Blocks 104 and 106 in FIG. 6. Motion Estimation Block 166, HVQ1 168, and HVQ2 170 may be the same as in Blocks 110, 116, and 118 in FIG. 6. Block 174 finds the minimum DR and output appropriate bits to a buffer 176, which interfaces which communication link 18. The bits are also output to a decoder 178, connected to a delay 180, similar to decoder 134 and delay 138 in FIG. 6.

The bufferlevel of Buffer 176 is passed to Compute New Lambda Block 184, which receives fdist information from either block 186 or 188, depending on the method chosen. Note that two methods of determining fdist are described above.

The above described buffer fullness and distortion feedback method has particular application in connection with floating point calculations. The following buffer fullness and distortion feedback method has particular application in connection with fixed point calculations. In many circumstances, floating point calculations are preferred in software applications, while fixed point calculations are preferred for hardware applications.

The following buffer fullness method and average distortion feedback is used to determine the $\lambda$ value for each block. Let yfdist be the weighted average distortion for the previous luminance frame, buflevel be the current buffer size, maxbuf be the maximum buffer size, and bpv be the number of bits allocated to a 16×16 block. Equation (5), below, is an example of a formula to calculate the $\lambda$ value of the luminance:

$$\lambda = \text{yfdist}\ (1/\text{bpv} + 16\ \text{buflevel}/\text{maxbuf}) \quad (5),$$

where 1/bpv is a number simulated as a fixed point with the resolution ¹⁄₃₂; 16 buflevel/maxbuf is a whole number rounded to a fixed point with ¹⁄₃₂ resolution; yfdist is a weighted average distortion; and the λ value is also a fixed point with ¹⁄₃₂ resolution (with the minimum λ value being ¹⁄₃₂ in the example). Note that the image size (total pixels) for the luminance component is approximated by the number $2^K/M$, where K and M may be integers. The precision for the yfdist parameter is ¹⁄₃₂ (as an example). The distortion average between the current frame yfdist and the current frame L1 distortion is used as the yfdist for the next frame. The yfdist parameter is initialized to be 1 for the first frame. For the second frame, it is the average L1 distortion for the first frame. After the second frame, the average process takes place.

For the chrominance components, the following formula is used to calculate the λ value. Let Tbit be the actual total bits used in the luminance frame (Y frame) and Abit be the number of target bits allocated in the Y frame. Additional examples are:

$$\lambda = (yfdist (1/bpv+16 \text{ buflevel/maxbuf})+2)/4$$

and if (Tbit<0.75 Abit)

$$\lambda = 2.0\lambda;$$

if (Tbit>1.5 Abit)

$$\lambda = 0.75\lambda.$$

b. Conditional Update Preselection

The following conditional update preselection feature has particular application in a software environment where calculation speed is less than desired. Depending on the circumstances, the feature may not be desirable in a dedicated hardware environment where computational speed is considerably faster than in the case of software. The feature has application where a block does not change much.

Figure 9:
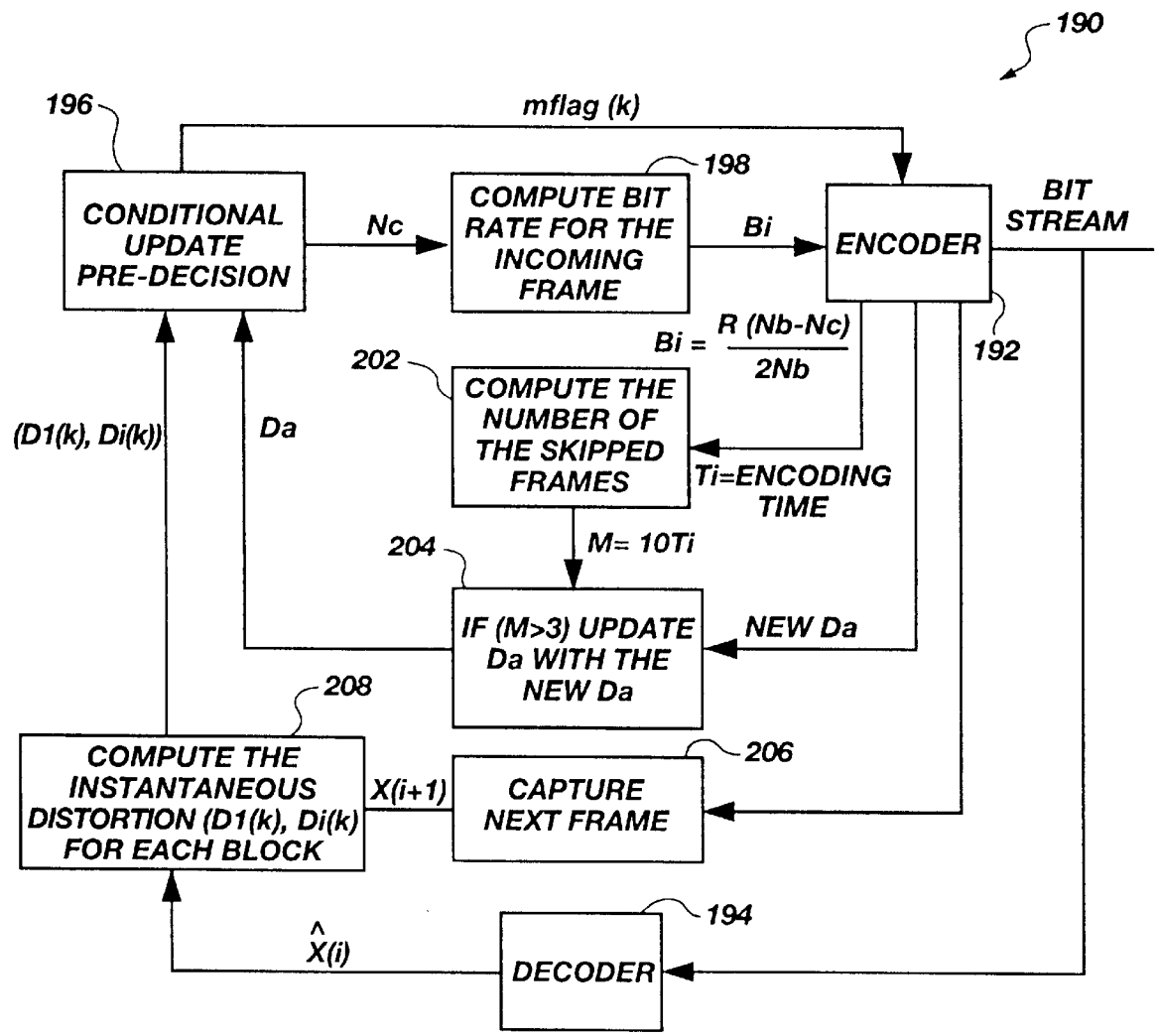
FIG. 9 is a block diagram illustrating a feature of the invention.

FIG. 9 illustrates a codec simplified optimal bit allocation algorithm with a lambda feedback mechanism. Referring to FIG. 9, a codec 190 comprises an encoder 192, a decoder 194, and other hardware represented as functional blocks. The other hardware performing the functions may be one or more microprocessors and/or dedicated hardware. Given the bit rate (available bits per second) and frame rate (frames per second (fps)), codec 190 will keep the frame rate as high as possible and try to achieve the specified bit rate. One version may attempt a constant frame rate, while another version may keep the frame rate as high as possible. FIG. 9 may be implement in software and/or hardware.

Codec 190 may have application in a personal computer based video telephone system. Present Intel Pentium microprocessor based technology may not be able to achieve real time encoding and decoding at over 10 fps. However, as processor performance improves it will be possible. FIG. 9 illustrates a variable frame rate codec which tries to achieve as high a frame rate as possible. The input bit rate (bits per frame) may be adjusted based on the amount of scene change between consecutive frames to achieve the goal.

Codec 190 of FIG. 9 is described as follows:

(a) The input image may be partitioned into 16×16 blocks in encoder 192. A conditional update mode pre-decision may be determined using the following criterion:

In Conditional Up-Date Pre-decision Block 196, if (D1(k)<Da) and (Di(k)<C), then the conditional update mode will be selected for the k-th block, where k may be the k-th block; D1(k) is the L1 instantaneous distortion for the k-th block, which is the average absolute distortion between the current block and the decompressed previous frame block; Di(k) is the L infinite instantaneous distortion for the k-th block which is the maximum absolute distortion between the original input block and the decompressed previous frame block; Da is the average absolute distortion occurred in encoding one of the previous frames; and C may be a constant (e.g. 20). Various variation may be used. For example, if (D1(k)<Da) and (Di(k)<Da), then the conditional update mode will be selected.

The flag to indicate whether the conditional update mode is chosen for each block may be sent to the encoder, which is called mflag(k) in the block diagram. The number of pre-determined conditional update blocks, Nc, may be sent to the bit rate computation block.

(b) Compute the bit rate, Bi, for the incoming frame 198. Bi may be computed by the following formula: Bi=((Nb-Nc)/Nb)(R/2), where Nb is the total number of 16×16 block, and R is the available rate (or bits per second).

(c) Given Bi and mflag(k), encode the current frame using a lambda feedback algorithm. The outputs of encoder 192 includes Ti (the time to encode this frame) to compute the number of skipped frames 202, Da (the average absolute distortion) to update Da 204, a signal telling the capture board to capture the next frame 206, and the output bit stream to decoder 194.

(d) Compute the number of the skipped frames 202, M, using the formula M=10Ti.

(e) Da updating 204: based on M decide whether Da should be updated by the new one. The decision criterion is as follows: If (M>3), then Da is updated with the new Da.

(f) Capture Next Frame Block 206 is initialized by the encoder and captures the next frame that is available. There may be frames that are "captured" by the camera or that otherwise exists in memory that are not "captured" by codec 190. That is, there may be skipped frames. The output of Capture Next Frame Block 206 is the current frame.

(g) Decoder 194 decompresses the frame using the bit stream from the encoder. The output of decoder 194 is the decompressed previous frame.

(h) Compute the instantaneous distortion D1(k) and Di(k) 208, using the incoming original frame and the decompressed previous frame.

Where a frame has a considerable amount of detail or successive frames have a considerable amount of changing detail, enough frames may need to be skipped that there may be some jerkiness in the image at the remote display.

c. Mode Preselection

The following method may be used to determine the coding mode e.g. modes a), b), c), or d)) for the input block. Let vdist be the L1 norm of the mean-removed input block, mdist be the L1 norm of the residual block from the 16×16 block matching method (i.e., from the motion estimated block), and mdist8 be the L1 norm of the residual block from the four 8×8 block matching method. (The L1 norm used may be the absolute difference between the current and predicted inputs without the average.) One version of the method is written in pseudo-code as follows:

```
If (vdist - 100 > min(mdist, mdist8))
{
    if (mdist - 100 < mdist8)
        the input block is 16x16 motion compensation coded.
    else
        the input block is 8x8 motion compensation coded.
}
else
    { the input block is intra-block coded.}
``` where min(x,y) outputs the minimum value of x and y.

A simplified algorithm is as follows, in which vdist is the L1 norm of the mean-removed input block and mdist is the L1 norm of the residual block from the 16×16 block matching method:
If (vdist−100>mdist)
    the input block is motion 16×16 coded.
else
    the input block is intra-block coded.

After the input block is intra-block, motion 16×16 or motion 8×8 HVQ coded, the bottom-up bit allocation method is used to find out the minimum rate-distortion value (MRDV) for this coded option. The MRDV for the conditional update option is also calculated. If the MRDV of the conditional update option is smaller than the MRDV of the coded option, the input block is conditional updated. Otherwise, the input block is encoded by the coding option.

The mode preselection techniques may be used in connection with $\lambda$ or without consideration of $\lambda$.

C. Additional Information and Variations

The various techniques may be mixed and matched. For example, the techniques described under sections 3.*a*, 3.*b*, and 3.*c* may be used alone or together. A system may include the techniques described in all the sections of the detailed description or any part of them.

Compression techniques other than VQ may be used in connection with DR=D+$\lambda$R.

The various features and functions described above may be performed by a microprocessor(s) and/or in dedicated hardware. One or more ASIC chips may be used. The above-described techniques may be implemented by software or software in combination with dedicated hardware. The Blocks of the figures may be implemented by software or software in combination with dedicated hardware. In preferred embodiments, differences between software and hardware implementation include the codebook size. Merely as examples, in a software implementation, codebooks with the block size 64, 32, 16 and 8 may be used. In a hardware version, codebooks with the block size 256, 128, 64, 32, 16 and 8 may be used. Pre-conditional conditional update and motion block pre-selected may be used in the software version to increase the coding speed.

Hierarchical motion blocks may be used (16×16 and 8×8). Also, the half pixel search may be performed on the true half-pixel image. In some embodiments of the hardware version, only 16×16 motion blocks are used. The half-pixel search may be 1 out of 8, that is, the half-pixel motion block is the block between the best match and the second best match on the full-pixel image.

The foregoing differences are merely examples and not requirements.

The present invention may be used in connection with the Internet. When a document is sent from one location to another via the Internet, it often is routed through several intermediary host computers, called Message Transfer Agents MTAs), in what is known as the Message Transfer System. Operating together, the MTAs relay messages and deliver them directly or indirectly through another MTA to the intended recipient.

In the case of color images, there may be three frames that produce a color image. Under certain schemes, Y, U, and V frames or Y, $C_R$, and $C_B$ frames provide a color image. Other schemes may be used. There various schemes may be used in the techniques discussed throughout the specification.

There are different possible encoding orders. Under one embodiment of the optimal bit allocation system, the U frame is encoded before the V and Y frames are encoded. Under one embodiment of the lambda feedback system, the Y frame is encoded before the U and V frames are encoded.

Where it is expected that large sections of background will not change, the sections can be scanned before real time imaging. For example, all relevant sections of a conference room could be scanned before a video conference. Video representations of the sections could be stored in memory. This technique may be called object based coding.

As used herein, the terms "connect," "connectable," or "connected" are not necessarily limited to a direct connection, but may include an indirect operational connection.

As used herein, the term "video" is used loosely to refer to electronic representations of an image and is not limited to a particular standard (such as the NTSC or PAL standard) or to a particular medium (such as a raster scan cathode ray tube or a liquid crystal display). As used herein, the term "frame" is not limited to a particular format, such as interlaced frames that form an image. Rather, a frame may contain an entire image or only part of an image.

It is preferable to make constants programmable, but they may be hardwired or set in a read only memory.

As used herein, the term "a less than relationship" refers to "less than" or "less than or equal to." The term "a greater than relationship" refers to "greater than" or "greater than or equal to." Therefore, where the inequalities < and > have been used, the inequalities $\leq$ and $\geq$ could be used.

The term "system" could include a device or devices that operate with or without software or firmware.

As used herein, the terms "comprise" and "include" are intended to not limit. For example, if a device is described as comprising or including an element, the device may also comprise or include other elements not expressly listed.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An image processing system comprising:
    at least one conductor to conduct data to be processed;
    local processing circuitry coupled to the at least one conductor to receive and process blocks of the data, to select indices in a compression process to represent each of said blocks of the data and to determine distortion between a first block and a second block of said data, the local processing circuitry being constructed to employ lambda feedback in which distortion associated with at least one previously processed block and the total data size of indices previously selected to represent blocks are used in selecting indices to represent unprocessed blocks; and
    output circuitry coupled to the local processing circuitry to output the selected indices.

2. The system of claim 1, wherein the local processing circuitry includes circuitry for determining a lambda ($\lambda$) for each block and for selecting indices for the block according to which indices minimize (d+λr), where d is a distortion caused by compression of the block, and r is a bit rate associated with the index representing the block.

3. The system of claim 1, wherein the lambda feedback includes using buffer fullness in selecting indices to represent unprocessed blocks.

4. The system of claim 1, wherein the local processing circuitry is constructed to perform a hierarchical vector quantization in selecting the indices.

5. The system of claim 1, further comprising:
a communications link coupled to the output circuitry; and
remote processing circuitry coupled to the communications link to receive the selected indices and perform a decompression process thereon.

6. The system of claim 1, wherein the local processing circuitry is constructed to select the indices to represent images at a fixed frame rate.

7. The system of claim 1, wherein the local processing circuitry calculates DR=D+λR, where D is a distortion for a frame of the group of data and R is approximately equal to a desired bit rate, and DR is computed through an examination of an intra block mode, a motion compensation mode, and a conditional update mode.

8. An image processing system comprising:
local memory storage to store a group of data to be processed;
local processing circuitry coupled to the local memory storage to receive blocks of the group of data and to select indices in a compression process to represent the blocks, the local processing circuitry being constructed to select the indices so that DR=D+λR is essentially a minimum, where D is a distortion for an unprocessed block of the group of data and R is approximately equal to a desired bit rate for the block, the local processing circuitry also being constructed to select indices to represent an unprocessed block according to a lambda (λ) determined in accordance with a distortion associated with the most recently processed block and the total data size of indices previously selected to represent blocks; and
output circuitry coupled to the local processing circuitry to output the selected indices.

9. The system of claim 8, wherein the minimum DR is computed through a hierarchical vector quantization technique.

10. The system of claim 8, wherein the minimum DR is computed through a bisection technique.

11. The system of claim 8, wherein the minimum DR is computed through a parallel bisection technique.

12. The system of claim 8, wherein the minimum DR is computed through an examination of an intra block mode, a motion compensation mode, and a conditional update mode.

13. The system of claim 8, further comprising:
a communications link coupled to the output circuitry; and
remote circuitry coupled to the communications link to interface with the output circuitry.

14. The system of claim 8, wherein the local processing circuitry is constructed to obtain λ by comprising all the blocks of a frame of the group of data.

15. The system of claim 8, wherein the local processing circuitry includes a microprocessor.

16. The system of claim 8, further comprising:
a communications link coupled to the output circuitry;
remote processing circuitry coupled to the communications link to receive the indices and process the indices; and
a remote display coupled to the remote processing circuitry to produce images in accordance with the processed indices and to simultaneously produce other images.

17. The system of claim 16, wherein the other images are produced as part of a conference call.

18. An image compression process comprising:
receiving a plurality of image blocks; and
for each block,
determining one or more indices suitable for representing said block;
calculating a block distortion $d_i$ and a block bit rate $r_i$ associated with each of the one or more indices;
determining a lambda λ for said block in accordance with an actual distortion associated with the block preceding said block through the compression process and the total data size of previously compressed blocks; and
selecting an index from among the one or more indices that has the minimum $d_i+\lambda r_i$ for said block.

19. The image compression process of claim 18, wherein the act of determining one or more indices suitable for representing said block comprises determining the one or more indices in accordance with at least one of an intra block mode and a motion compensation mode.

20. The image compression process of claim 18, wherein the act of calculating a block distortion $d_i$ comprises calculating an L1 norm distortion.

21. The image compression process of claim 18, further comprising outputting the selected indices through an output buffer, wherein the act of determining a lambda λ for said block comprises determining the lambda λ for said block in accordance with an actual distortion fdist associated with the block preceding said block through the compression process and the total data size of data stored in the output buffer.

22. An image compression system comprising:
circuitry for receiving a plurality of image blocks and, for each block, determining one or more indices suitable for representing said block and calculating a block distortion $d_i$ and a block bit rate $r_i$ associated with each of the one or more indices;
circuitry for determining, for each block, a lambda λ for said block in accordance with an actual distortion associated with the block preceding said block through the compression system and the total data size of previously compressed blocks; and
circuitry coupled to the image block receiving circuitry and the lambda determining circuitry for selecting, for each block, an index from among the one or more indices determined suitable for said block that has the minimum $d_i+\lambda r_i$ for said block.

23. The image compression system of claim 22, wherein the image block receiving circuitry includes motion estimation circuitry and vector quantization circuitry.

24. The image compression system of claim 22, further comprising an output buffer coupled to the index selecting circuitry for outputting the selected indices.

25. An image processing system comprising:
circuitry for receiving a plurality of image blocks and, for each block, determining one or more indices suitable for representing said block and calculating a block distortion $d_i$ and a block bit rate $r_i$ associated with each of the one or more indices;

circuitry for determining, for each block, a lambda $\lambda$ for said block in accordance with an actual distortion associated with the block preceding said block through the compression system and the total data size of previously compressed blocks;

circuitry coupled to the image block receiving circuitry and the lambda determining circuitry for selecting, for each block, an index from among the one or more indices determined suitable for said block that has the minimum $d_i + \lambda r_i$ for said block;

a communications link coupled to the index selecting circuitry for receiving and conducting the selected indices; and decompression circuitry coupled to the communications link for converting the selected indices to image blocks.

* * * * *